INVENTOR.
E. H. HUGENHOLTZ
BY
Frank R. Trifari
AGENT

INVENTOR.
E. H. HUGENHOLTZ

BY

Frank R. Jifare
AGENT

United States Patent Office 3,084,330

Patented Apr. 2, 1963

3,084,330

FREQUENCY CONVERTING CIRCUIT WITH MIXING ELEMENT IN INPUT CIRCUIT OF AMPLIFYING DEVICE

Eduard Herman Hugenholtz, Toronto, Ontario, Canada, assignor to North American Philips Company, Inc., New York, N.Y., a corporation of Delaware Filed Nov. 10, 1959, Ser. No. 852,054
7 Claims. (Cl. 325—440)

The invention relates to a frequency converting circuit arrangement comprising a mixing element and a self-oscillating electronic amplifying device. It has for its object to provide an improvement in gain and stability over that found in self-oscillating mixer circuits.

Self-oscillating mixer circuits are frequency converter circuits in which the mixing and oscillation functions are achieved by the same amplifying device, such as an electron tube or transistor. Although self-oscillating mixing circuits provide economy of space and components, they also provide several disadvantages. Since the input circuit is connected to an oscillating electronic amplifying device in a self-oscillating mixer, radiation of the oscillating signal at the given or local oscillator frequency through the input circuit may exceed tolerable limits and as a result, special filtering may be required.

Another disadvantage of self-oscillating mixer circuits is the low gain of the electronic amplifying device which is a result of the biasing or operating point at which the electronic amplifying device is set to permit it to mix satisfactorily. In addition, the input circuit of the electronic amplifying device provides high damping of a signal at a high value of radio frequency, which further reduces the gain of the system.

A further disadvantage of self-oscillating mixer circuits is the tendency for the oscillations of the local oscillator to be pulled or blocked entirely by a strong input radio frequency signal. Blocking or frequency pulling of the local oscillator is particularly noticeable when a receiver employing a self-oscillating mixer circuit is tuned to a weak or distant station with a strong local station occupying the adjacent channel.

Self-oscillating mixers generally exhibit a tendency towards instability of the local oscillator when the tuned circuit for the input radio frequency signal is varied. This is due to the inherent coupling of the tuned circuit for the input signal and the tuned circuit for the local oscillator.

In order to prevent positive or negative feedback of the intermediate frequency and still permit amplification at this frequency, it has been generally necessary to employ an oscillator which utilized a frequency determining circuit which compels the oscillator to oscillate at the given frequency connected between the output and input of the electronic amplifying device or between plate and grid, when a tube is used as the electronic amplifying device, in order to permit the signal at the second value of frequency to be connected to the input or grid, and yet not have the amplified signal at the second value of frequency at the plate fed back through the given frequency circuit to the grid. When a circuit is connected between the input and output of the electronic amplifying device, a greater interaction of the input and output tuned circuits takes place, making the individual adjustment of any one of these circuits difficult.

The frequency converting arrangement according to this invention mitigates the previously mentioned disadvantages of self-oscillating mixer circuits by carrying out the mixing process in a separate mixing element located in the input circuit of the electronic amplifying device. In this arrangement the amplifying device is adapted to oscillate at the local oscillation frequency, the local oscillations being coupled to the mixing element. The input radio frequency signal is also coupled to the mixing element where it is mixed with the signal at the given frequency to produce the intermediate frequency signal. The intermediate frequency signal is coupled back to the electronic amplifying device and is amplified in this device. A special advantage possible with this arrangement is that the oscillator frequency determining circuit is located totally in the input circuit of the electronic amplifying device, eliminating the output to input local oscillation frequency determining circuit.

Since the mixing element may be a vacuum diode with a separate cathode contained in the same envelope as the electronic amplifying device when a tube is employed or a simple semiconductor diode when either a tube or a transistor is employed as the amplifying device, the increase in cost is low and the added space required is extremely small. Therefore, the basic advantages of the self-oscillating mixer, which are the use of few components and low cost, are maintained.

The separate mixing element in this invention provides a separation of the signal at the given frequency from the input circuit and thus reduces radiation of this signal. The higher mixing efficiency of this separate mixing element and the higher amplification of the electronic amplifying device when it is not biased to mix provide a greater overall gain. In addition, the electronic amplifying device provides less damping to the lower intermediate frequencies and therefore provides an even greater gain.

Due to the separation of the circuit containing the oscillations of the local oscillator frequency and the electronic amplifying device provided by the separate mixing element, frequency pulling and blocking of the oscillator is substantially reduced. In addition, this separation also enhances the stability of the oscillator as the tuning circuit for the oscillator is varied.

Since the local oscillator frequency determining circuit is located totally in the input circuit of electronic amplifying device, adjustment of the tuned circuits in the output and input of the electronic amplifying device will have less effect on each other and thus facilitate their individual tuning.

In order that the invention may be readily carried into effect, it will now be described in greater detail with reference to the accompanying drawing, in which.

Figure 1:
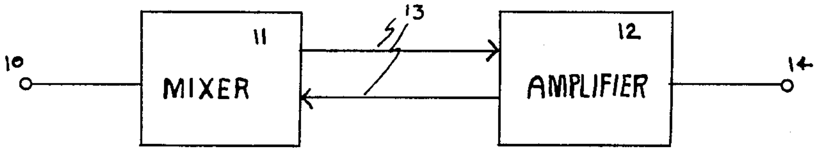
FIG. 1 is a block diagram of a frequency converting circuit according to the invention.

FIG. 1 shows a block diagram of the invention in which the input terminals 10 of the mixing element 11 receive the input radio frequency signals. The electronic amplifying device 12, which is adapted to oscillate at a given frequency, is coupled to the mixing element 11 through coupling 13 to permit the signal at the given frequency to be conveyed to the mixing element 11 where it mixes with the input radio frequency signals to produce the intermediate frequency signals. The intermediate frequency signals are coupled to the electronic amplifying device 12 through the coupling 13. The amplified intermediate frequency signals are derived at the output terminals 14 of the electronic amplifying device 12.

Figure 2:
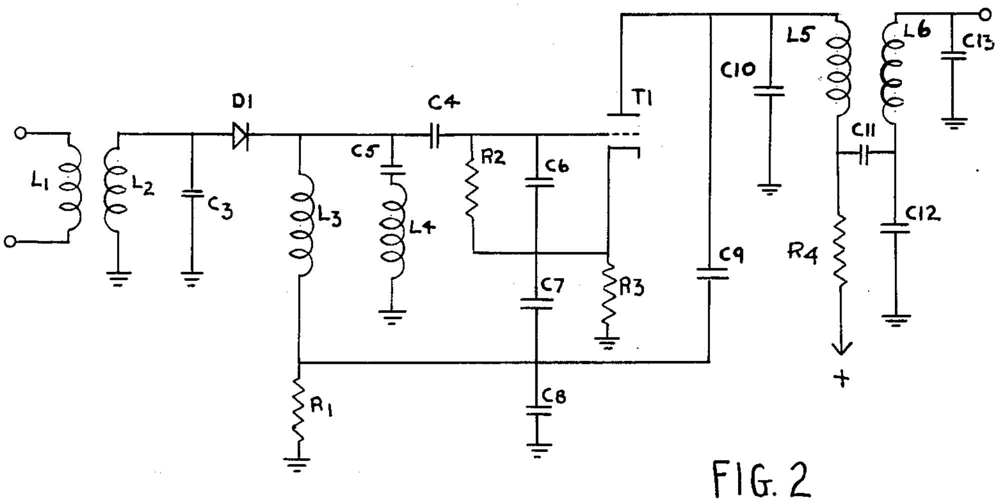
FIG. 2 is a circuit diagram illustrating one embodiment of the invention.

FIG. 2 illustrates an embodiment of the invention which employs a semiconductor diode $D_1$ as the mixing element and a vacuum tube triode $T_1$ as the electronic amplifying device. In this circuit the radio frequency signal is coupled from inductor $L_1$ to inductor $L_2$. $L_2$ and $C_3$ are resonant at the frequency of the input signals and the radio frequency signals are impressed on semiconductor diode $D_1$. Inductor $L_4$ in conjunction with the triode $T_1$ and capacitors $C_6$, $C_7$, $C_8$ and the input capacity of $T_1$ form a Colpitts oscillator which is adapted to oscillate at a given frequency. Since the oscillator oscillations are generated across the inductor $L_4$, they are also impressed on diode $D_1$ through capacitor $C_5$. The inductor $L_3$ in conjunction with $C_6$, $C_7$, $C_8$ and the input capacity of the triode $T_1$ form a resonant circuit at the intermediate frequency.

Figure 3:
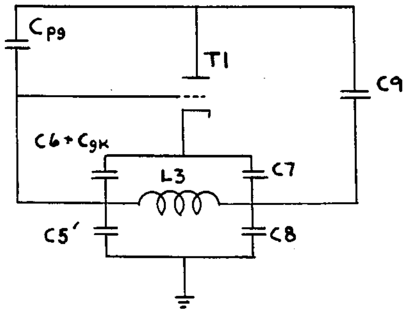
FIG. 3 is a circuit diagram of a portion of the circuit of FIG. 2 illustrated as a bridge circuit.

FIG. 3 illustrates a portion of the circuit of FIG. 2 as a bridge circuit, wherein the alternating component of cathode current is fed around inductor $L_3$ through two paths. The first path is through $C_7$ and $C_8$ and the second is through $C_6+C_{gk}$ and $C_5+L_4$. $C_5+L_4$ form at the intermediate frequency an effective capacitance designated $C_5'$. The ratio of $C_6+C_{gk}$ to $C_5'$ is equal to the ratio of $C_7$ to $C_8$. In this way, the cathode current forms no feedback voltage across $L_3$ and, therefore, the electronic amplifying device does not oscillate at the intermediate frequency. $C_9$ has the function in this circuit of neutralizing the plate to grid capacity $C_{pg}$.

Although the bridge circuit prevents oscillation at the intermediate frequency, the signal of the intermediate frequency is coupled through the direct current blocking condenser $C_4$ to the grid of the electronic amplifying device wherein it is amplified and derived at the tuned circuit comprised of $L_5$, $C_{10}$ and the output capacity of $T_1$. The amplified version of the signal at the intermediate frequency is coupled from $L_5$ to input of the next stage which is comprised of $L_6$ and $C_{13}$.

In this circuit, $R_1$ serves as a direct current return for the diode $D_1$. $R_2$ serves as a direct current return for the grid of $T_1$. $R_3$ serves in place of a choke to maintain the cathode of $T_1$ at an alternating potential above ground. $R_4$ serves to de-couple the direct current plate supply voltage for $T_1$. $C_{11}$ and $C_{12}$ serve to place the lower connections of $L_5$ and $L_6$ at alternating current ground.

Purely by way of illustration and in no sense by way of limitation, the following circuit component values may be employed in the circuit of FIG. 2:

| | |
|---|---|
| Capacitor $C_3$ | 4.7 $\mu\mu$f. |
| Capacitor $C_4$ | 1000 $\mu\mu$f. |
| Capacitor $C_5$ | 6.8 $\mu\mu$f. |
| Capacitor $C_6$ | 4 $\mu\mu$f. |
| Capacitor $C_7$ | 6.8 $\mu\mu$f. |
| Capacitor $C_8$ | 10 $\mu\mu$f. |
| Capacitor $C_9$ | 1 $\mu\mu$f. |
| Capacitor $C_{10}$ | 10 $\mu\mu$f. |
| Capacitor $C_{11}$ | 1000 $\mu\mu$f. |
| Capacitor $C_{12}$ | 120 $\mu\mu$f. |
| Capacitor $C_{13}$ | 10 $\mu\mu$f. |
| Resistor $R_1$ | 15K ohms. |
| Resistor $R_2$ | 100K ohms. |
| Resistor $R_3$ | 1500 ohms. |
| Device $T_1$ | Tube 6ER5. |
| Device $D_1$ | Germanium diode 1N87A. |
| Inductor $L_1$ | 1.7 $\mu$h. |
| Inductor $L_2$ | 1.5 $\mu$h. |
| Inductor $L_3$ | 1.1 $\mu$h. |
| Inductor $L_4$ | 0.4 $\mu$h. |
| Inductor $L_5$ | 1.1 $\mu$h. |

Figure 4:
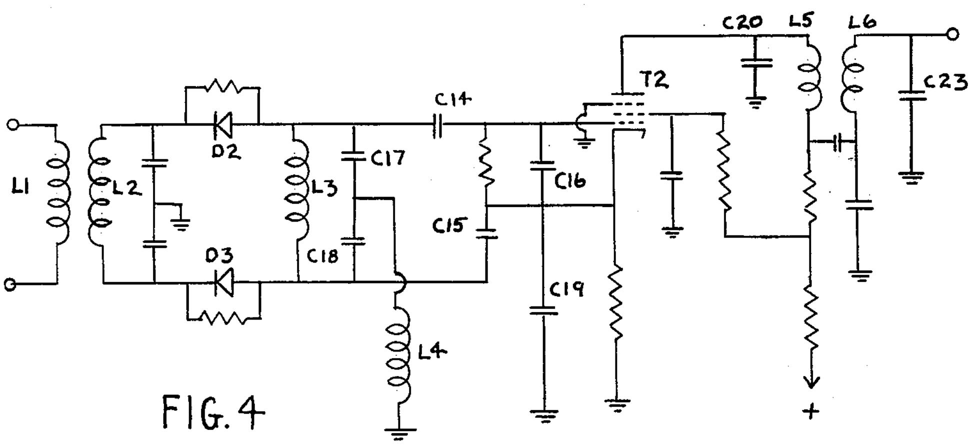
FIG. 4 is a circuit diagram illustrating another embodiment of the invention.

FIG. 4 illustrates a frequency converter which utilizes two diodes in a balanced mixer circuit, and a pentode in the oscillator-amplifier circuit. Inductor $L_1$ couples the radio frequency signal to the semiconductor diodes $D_2$ and $D_3$ through inductor $L_2$. Inductor $L_4$ in conjunction with capacitors $C_{17}$, $C_{14}$, $C_{16}$, $C_{18}$, $C_{15}$ and $C_{19}$ and pentode $T_2$ form an oscillator at a given frequency. The signal at the given frequency across $L_4$ is coupled to the diodes through capacitors $C_{17}$ and $C_{18}$ where it mixes the input signal to produce the intermediate frequency which is impressed across a circuit tuned to this frequency and composed of inductor $L_3$ in conjunction with capacitors $C_{17}$, $C_{18}$, $C_{14}$, $C_{15}$ and $C_{16}$. The intermediate frequency signal across inductor $L_3$ is coupled through the direct current blocking capacitor $C_{14}$ to the control grid of the pentode $T_2$ where it is amplified.

The amplified version of the intermediate frequency signal is derived across the plate tuned circuit comprised principally of inductor $L_5$, capacitor $C_{20}$ and the output capacity of tube $T_2$. The amplified intermediate frequency signal is coupled from inductor $L_5$ to inductor $L_6$. Inductor $L_6$, capacitor $C_{23}$ and the input capacity of the amplifying device of the next stage form the input tuned circuit at the intermediate frequency for the next stage.

Figure 5:
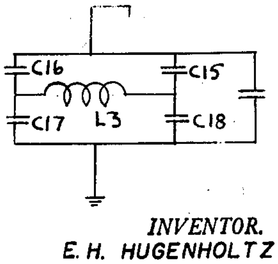
FIG. 5 is a circuit diagram of a portion of the circuit of FIG. 4 illustrated as a bridge circuit.

The bridge circuit of FIG. 5 is a portion of the circuit of FIG. 4 in bridge form. This circuit illustrates the means by which oscillation at the intermediate frequency is prevented. The ratio of capacitor $C_{15}$ to capacitor $C_{13}$ is chosen equal to the ratio of capacitor $C_{16}$ to capacitor $C_{17}$. In this way no intermediate frequency component of the cathode current is impressed across inductor $L_3$ and therefore there is no feedback at the intermediate frequency.

Figure 6:
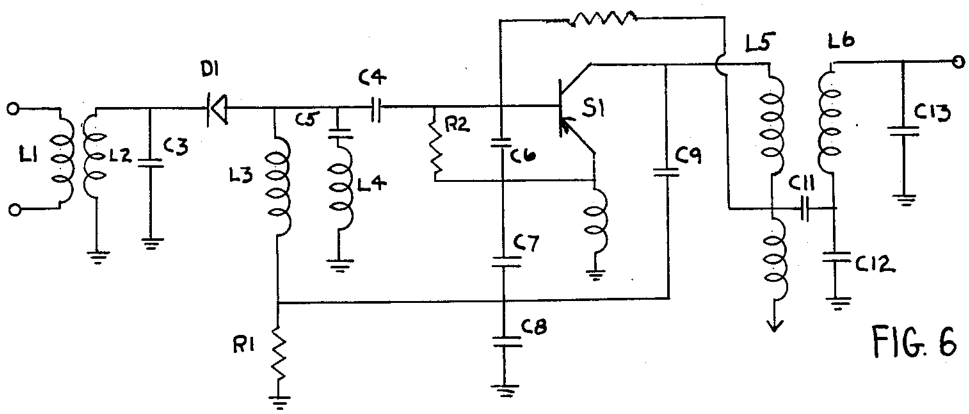
FIG. 6 is a circuit diagram of still another embodiment of the invention.
Figure 7:
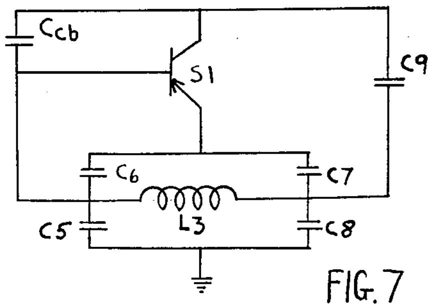
FIG. 7 is a circuit diagram of a portion of the circuit of FIG. 6 illustrated as a bridge circuit.

FIG. 6 illustrates a modification of the frequency converter of FIG. 2, utilizing a transistor $S_1$ as the electronic amplifying device and a semiconductor diode $D_1$ as the mixing element. FIG. 7 illustrates the bridge circuit of the circuit of FIG. 6, which prevents oscillation at the intermediate frequency. The principle of operation of the circuit of FIGS. 6 and 7 is identical to that of FIGS. 2 and 3 with the exception of the standard biasing arrangement required for the transistor.

While the invention has been described by means of specific examples and in specific embodiments, I do not wish to be limited thereto, for obvious modifications will occur to those skilled in the art without departing from the spirit and scope of the invention.

What I claim is:

1. A frequency converting circuit comprising an amplifying device having at least an input electrode, a common electrode, and an output electrode, a point of reference potential, tuned circuit means connected between said input electrode and said point of reference potential, means respectively connecting said common electrode to said tuned circuit whereby local oscillations are generated, a source of high frequency oscillations, a mixing device having first and second terminals, means connecting said source between said first terminal and said point of reference potential, means connecting said second terminal to said input electrode whereby said high frequency oscillations and local oscillations are mixed in said mixing device to provide oscillations of an intermediate frequency and said intermediate frequency oscillations are applied to said input electrode, and output circuit means connected to said output electrode to derive amplified intermediate frequency oscillations therefrom.

2. The circuit of claim 1 in which said mixing device comprises a pair of diodes connected in a balanced circuit.

3. The circuit of claim 1 in which said amplifying device is an electron discharge tube.

4. The circuit of claim 1 in which said amplifying device is a transistor having base, emitter and collector electrodes, said input, common and output electrodes comprising said base, emitter and collector electrodes, respectively.

5. A frequency converting circuit comprising an electron discharge tube having cathode, control grid, and anode electrodes, impedance means connecting said cathode to ground, a local oscillation frequency determining circuit regeneratively connected to said tube for providing local oscillations comprising first and second serially connected capacitors connected in parallel with first inductance means between said control grid and ground, and means connecting the junction of said capacitors to said cathode, a source of high frequency oscillations, a diode mixing device, means applying said high frequency oscillations to said mixing device, and means connecting said mixing device to said control grid electrode whereby said local oscillations and high frequency oscillations are mixed in said mixing device to provide intermediate oscillations, and said intermediate oscillations are applied to the control grid electrode of said discharge tube.

6. A frequency converting circuit comprising an electron discharge tube having cathode, control grid, and anode electrodes, impedance means connecting said cathode to ground, a local oscillation frequency determining circuit regeneratively connected to said tube for providing local oscillations comprising first, second and third serially connected capacitors connected in parallel with first inductance means between said control grid and ground, means connecting the junction of said first and second capacitors to said cathode, intermediate frequency determining means non-regeneratively connected to said tube comprising second inductance means connected in parallel with said first and second capacitors, a fourth capacitor, means serially connecting said fourth capacitor and third capacitor in parallel with said second inductor, neutralizing capacitor means connected between said anode and the junction of said second and third capacitors, a source of high frequency oscillations, a diode mixing device, means applying said high frequency oscillations to said mixing device, and means connecting said mixing device to said control grid electrode whereby said local oscillations and high frequency oscillations are mixed in said mixing device to provide intermediate oscillations, and said intermediate oscillations are applied to the control grid electrode of said discharge tube.

7. A frequency converting circuit comprising an amplifying device having at least an input electrode, an output electrode, and a common electrode, a source of high frequency oscillations, diode means having first and second terminals, first tuned circuit means connected between said input electrode and a point of reference potential, second tuned circuit means connected between said input electrode and point of reference potential, bridge means connecting said common electrode to said first and second tuned circuits to provide self-generated local oscillations of the frequency of said first tuned circuit and to prevent self-oscillations at the frequency of said second tuned circuit, means connecting said source of high frequency oscillations between said first terminal and said point of reference potential, means connecting said second terminal to said input electrode whereby said high frequency and local oscillations are mixed in said diode means to produce intermediate frequency oscillations that are applied to said second tuned circuit and input electrode, said second tuned circuit being tuned to the frequency of said intermediate oscillations, and output circuit means for deriving amplified intermediate frequency oscillations from said output electrode.

References Cited in the file of this patent

UNITED STATES PATENTS 2,789,215 Pan ------------------ Apr. 16, 1957